United States Patent
Park et al.

(10) Patent No.: US 9,632,437 B2
(45) Date of Patent: Apr. 25, 2017

(54) LITHOGRAPHY APPARATUS, METHOD FOR LITHOGRAPHY AND STAGE SYSTEM

(71) Applicant: Samsung Electronics Co., Ltd., Suwon-Si, Gyeonggi-Do (KR)

(72) Inventors: Jin-Hong Park, Yongin-si (KR); Jeong-Ho Yeo, Suwon-si (KR); Joo-On Park, Seongnam-si (KR); Chang-Min Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 332 days.

(21) Appl. No.: 13/942,854

(22) Filed: Jul. 16, 2013

(65) Prior Publication Data
US 2014/0111782 A1    Apr. 24, 2014

(30) Foreign Application Priority Data
Oct. 23, 2012   (KR) .................. 10-2012-0117948

(51) Int. Cl.
*G03F 7/20* (2006.01)

(52) U.S. Cl.
CPC ............... *G03F 7/70916* (2013.01)

(58) Field of Classification Search
CPC ...... G03F 7/702; G03F 7/707; G03F 7/70708; G03F 7/70716; G03F 7/70908; G03F 7/70916
See application file for complete search history.

(56) References Cited

U.S. PATENT DOCUMENTS

| | | | |
|---|---|---|---|
| 5,434,648 A * | 7/1995 | Koga et al. | 355/76 |
| 5,559,584 A * | 9/1996 | Miyaji | G03F 7/70058 355/30 |
| 6,198,792 B1 | 3/2001 | Kanouff et al. | |
| 6,665,046 B2 * | 12/2003 | Nogawa et al. | 355/30 |
| 6,714,279 B2 | 3/2004 | Banine et al. | |
| 6,933,513 B2 * | 8/2005 | Van Empel et al. | 250/492.3 |
| 7,202,934 B2 | 4/2007 | Moors et al. | |
| 7,875,864 B2 | 1/2011 | Sogard | |
| 2002/0176060 A1 * | 11/2002 | Park | 355/53 |
| 2005/0275835 A1 | 12/2005 | Sogard | |
| 2006/0131682 A1 * | 6/2006 | Moors et al. | 257/432 |
| 2007/0079525 A1 * | 4/2007 | Sogard | 34/275 |
| 2007/0285632 A1 | 12/2007 | Phillips et al. | |
| 2009/0207394 A1 * | 8/2009 | Shibazaki | 355/53 |
| 2012/0026474 A1 * | 2/2012 | Nayfeh | 355/30 |
| 2015/0049323 A1 * | 2/2015 | Bal | G03F 7/70866 355/75 |

FOREIGN PATENT DOCUMENTS

| | | | |
|---|---|---|---|
| JP | 2947018 B2 * | 9/1999 | |
| JP | 2007-013054 A | 1/2007 | |

(Continued)

*Primary Examiner* — Steven H Whitesell Gordon
(74) *Attorney, Agent, or Firm* — Harness, Dickey & Pierce, P.L.C.

(57) ABSTRACT

Provided are a lithography apparatus, a method for lithography and a stage system. The lithography apparatus includes a reticle stage having a reticle, at least one nozzle on at least one surface of the reticle stage and configured to allow shielding gas to flow to a surface of the reticle to form an air curtain, and a gas supply unit configured to supply the nozzle with the shielding gas.

20 Claims, 12 Drawing Sheets

(56) References Cited

FOREIGN PATENT DOCUMENTS

| | | |
|---|---|---|
| JP | 2007-242863 A | 9/2007 |
| JP | 2011-237718 A | 11/2011 |
| KR | 2002-0051671 A | 6/2002 |
| KR | 2004-0070743 A | 8/2004 |
| KR | 10-0641579 B1 | 10/2006 |
| KR | 2006-0131241 A | 12/2006 |

* cited by examiner

LITHOGRAPHY APPARATUS, METHOD FOR LITHOGRAPHY AND STAGE SYSTEM

CROSS-REFERENCE TO RELATED APPLICATION

This application claims priority from Korean Patent Application No. 10-2012-0117948 filed on Oct. 23, 2012, in the Korean Intellectual Property Office, and all the benefits accruing therefrom under 35 U.S.C. 119, the contents of which in its entirety are herein incorporated by reference.

BACKGROUND

1. Field of the Inventive Concept

Example embodiments relate to a lithography apparatus, a method for lithography and/or a stage system.

2. Description of the Related Art

As semiconductor patterns continue to shrink, lithography using extreme ultraviolet (EUV) light is employed in the course of transferring patterns of a designed circuit layout onto a wafer.

SUMMARY

Some example embodiments provide a lithography apparatus, which can protect a reticle surface from particles by directing a shielding gas to the reticle surface.

Some example embodiments also provide a method for lithography, which can protect a reticle surface from particles by directing a shielding gas to the reticle surface.

Some example embodiments also provide a stage system, which can protect a reticle surface from particles by directing a shielding gas to the reticle surface.

These and other objects of the example embodiments will be described in or be apparent from the following description of some example embodiments.

According to some example embodiments, there is provided a lithography apparatus including a reticle stage having a reticle, at least one nozzle on at least one surface of the reticle stage and directing shielding gas to flow to a surface of the reticle to form an air curtain, and a gas supply unit that supplies the nozzle with the shielding gas.

According to some example embodiments, there is provided a method for lithography including directing shielding gas to a surface of a reticle on a reticle stage to form an air curtain using at least one nozzle on at least one surface of the reticle stage, and irradiating the reticle with an exposure light.

According to still other example embodiments, there is provided a stage system including a reticle stage having a reticle, and at least one nozzle on at least one surface of the reticle stage and to direct shielding gas to flow to a surface of the reticle to form an air curtain.

According to some example embodiments, there is provided a lithography apparatus including one or more nozzles on at least one surface of a reticle stage and configured to supply a shielding gas to a surface of a reticle; and a gas supply unit configured to supply the one or more nozzles with the shielding gas.

A first portion of the one or more nozzles may direct the shielding gas in a first direction and a second portion of the one or more nozzles may direct the shielding gas in a second direction, the first portion of the one or more nozzles alternatingly spaced with the second portion of the one or more nozzles.

A first portion of the one or more nozzles may direct the shielding gas in a first direction and a second portion of the one or more nozzles may direct the shielding gas in a second direction opposite to the first direction, the first portion of the one or more nozzles and the second portion of the one or more nozzles opposing each other.

The one or more nozzles may be configured to supply the shielding gas while rotating, forming an air curtain in a fan shape. The one or more nozzles may include a first nozzle and a second nozzle, the second nozzle forming the air curtain in the fan shape opposite the first nozzle.

The lithography apparatus may include a source configured to supply exposure light; at least one illumination system reflection mirror configured to reflect the exposure light to the reticle stage; at least one projection optics reflection mirror configured to project the reflected exposure light onto a wafer; and a wafer stage on which the wafer is fixed. The exposure light may be extreme ultraviolet (EUV) light.

BRIEF DESCRIPTION OF THE DRAWINGS

The above and other features and advantages of example embodiments of inventive concepts will become more apparent by describing in detail some example embodiments thereof with reference to the attached drawings in which.

DETAILED DESCRIPTION OF EXAMPLE EMBODIMENTS

Figure 1:
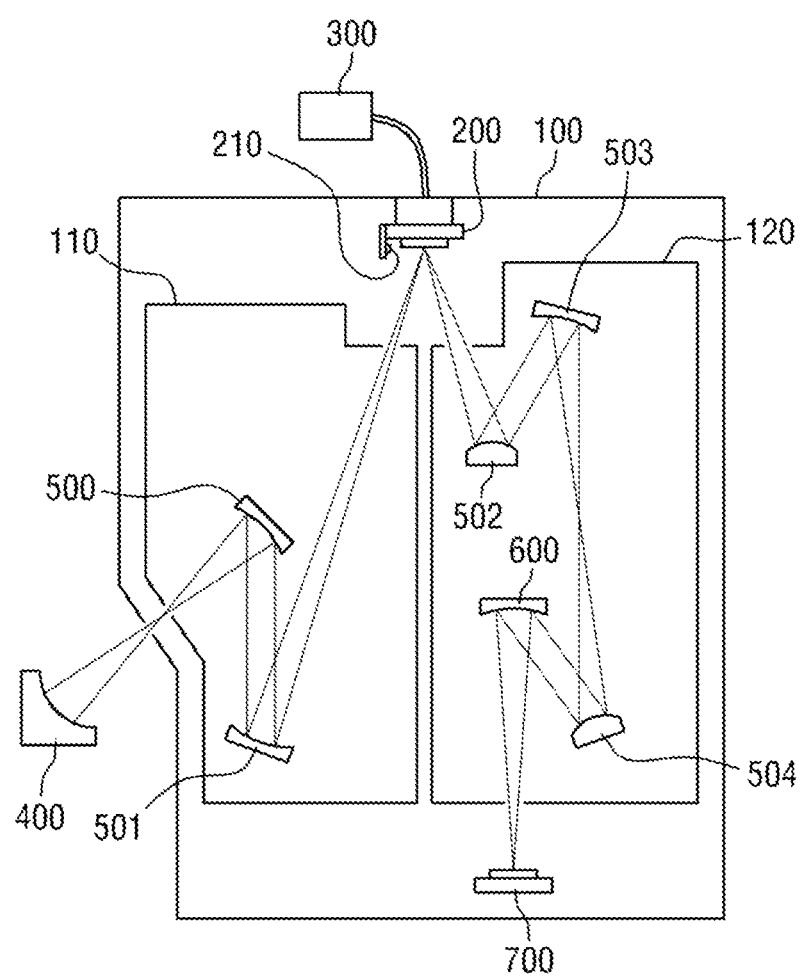
FIG. 1 illustrates a lithography apparatus according to an example embodiment of inventive concepts.

The present invention will now be described more fully hereinafter with reference to the accompanying drawings, in which some example embodiments are shown. This invention may, however, be embodied in different forms and should not be construed as limited to the example embodiments set forth herein. Rather, these example embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which some example embodiments of the invention are shown. Thus, the profile of an example view may be modified according to manufacturing techniques and/or allowances. That is, the example embodiments are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

In the following description, the example embodiments are directed to the lithography apparatus and method and the stage system provided to protect a reticle surface from particles by allowing shielding gases to the reticle surface. A number of particles may be generated in dynamic modules around the reticle stage (for example, Unicom, ReMa, etc.). Conventionally, contamination of a reticle surface due to particles has been prevented by forming a pellicle on the reticle surface. For example, reducing failures of transfer patterns has been attempted using the pellicle. However, as lithography using EUV light has recently been used, the pellicle cannot be used because the pellicle absorbs EUV light and lowers transmittance of the EUV light.

Figure 2:
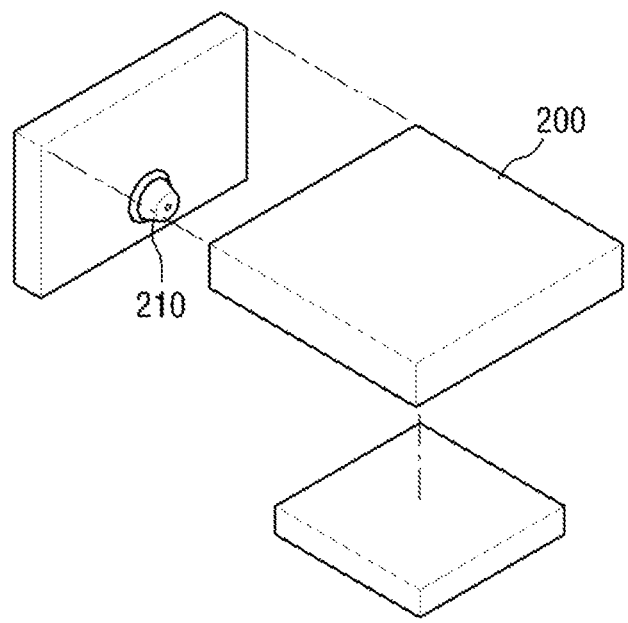
FIG. 2 is a partially exploded perspective view of the lithography apparatus shown in FIG. 1.
Figure 3:
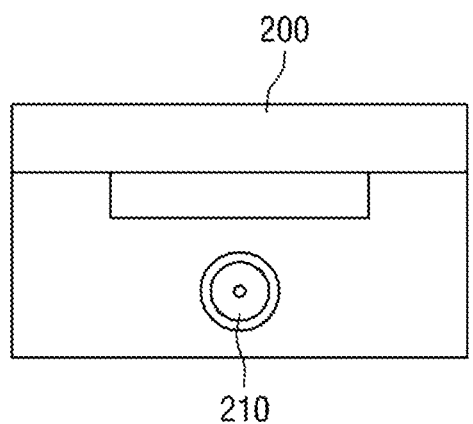
FIG. 3 is a partially front view of the lithography apparatus shown in FIG. 1.
Figure 4:
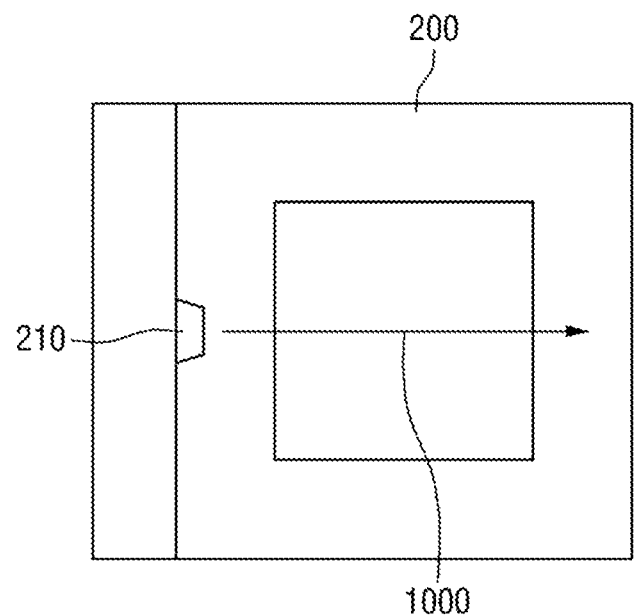
FIG. 4 is a bottom view of a portion of the lithography apparatus shown in FIG. 1.

FIG. 1 illustrates a lithography apparatus according to an example embodiment of inventive concepts, FIG. 2 is a partially exploded perspective view of the lithography apparatus shown in FIG. 1, FIG. 3 is a partially front view of the lithography apparatus shown in FIG. 1 and FIG. 4 is a bottom view of a portion of the lithography apparatus shown in FIG. 1.

Referring first to FIG. 1, the lithography apparatus may include a main chamber 100, a first sub chamber 110, a second sub chamber 120, a reticle stage 200, a gas supply unit 300, a source 400, reflection mirrors 500 and 501 for an illumination system, reflection mirrors 502, 503, 504 and 600 for a projection optical system, and a wafer stage 700.

The main chamber 100 includes the first sub chamber 110, the second sub chamber 120, the reticle stage 200, the illumination system reflection mirrors 500 and 501, the projection optical system reflection mirrors 502, 503, 504 and 600 and the wafer stage 700. The inside of the main chamber 100 may be maintained at vacuum.

The first sub chamber 110 is positioned in the main chamber 100. At least one of the illumination system reflection mirrors 500 and 501 may be placed in the first sub chamber 110. Exposure light may be reflected in the illumination system reflection mirrors 500 and 501 to reach the reticle stage 200. To increase reflection efficiency of exposure light, the inside of the first sub chamber 110 may be maintained at vacuum.

The second sub chamber 120 is positioned in the main chamber 100. At least one of the projection optical system reflection mirrors 502, 503, 504 and 600 may be placed in the second sub chamber 120. The exposure light reflected from the reticle surface may be reflected at the projection optical system reflection mirrors 502, 503, 504 and 600 to then be irradiated into the wafer. To increase a reflection efficiency of exposure light, the inside of the second sub chamber 120 may be maintained at vacuum.

The reticle stage 200 is positioned at an upper portion of the main chamber 100. The reticle is fixed on the reticle stage 200. An electrostatic force may be applied to a clamp to which the reticle is fixed. The reticle stage 200 may include a nozzle 210. The reticle stage 200 may perform a scanning operation.

The gas supply unit 300 is positioned outside the main chamber 100. The gas supply unit 300 supplies the clamp of the reticle stage 200 and the nozzle 210 with gases. For example, a backfill gas is supplied to the clamp of the reticle stage 200 and a shielding gas for forming an air curtain is supplied to the nozzle 210. The backfill gas and the shielding gas may be the same gas. For example, a hydrogen ($H_2$) gas used as the backfill gas may also be used as the shielding gas. Since the same gas is used, a configuration of the lithography apparatus can be simplified.

The source 400 is positioned outside the main chamber 100. The source 400 may irradiate exposure light into the reflection mirror 500 in the first sub chamber 110. The source 400 may be, for example, a discharge produced plasma (DPP) EUV light source, a laser produced plasma (LPP) EUV light source, a hybrid EUV light source, a synchrotron EUV light source, or the like.

The reflection mirrors 500, 501, 502, 503, 504 and 600 are positioned in the first sub chamber 110 and the second sub chamber 120. The reflection mirrors 500, 501, 502, 503, 504 and 600 may be, for example, oblique incidence mirrors into reflecting surfaces of which the exposure light irradiated from the source 400 is incident at oblique incidence angles, multiplex multilayered mirrors, or the like. To transfer finer patterns on a wafer, the projection optical system reflection mirrors 502, 503, 504 and 600 may have high resolution. The number of the reflection mirrors 500, 501, 502, 503, 504 and 600 may be, for example, 6, but example embodiments are not limited thereto.

The wafer stage 700 is positioned under the main chamber 100. The wafer is fixed on the wafer stage 700. The wafer stage 700 may move for fine alignment. In addition, the wafer stage 700 may move in a particular direction to perform a lithography process.

Referring to FIGS. 2 to 4, the nozzle 210 is formed on one surface of the reticle stage 200.

The nozzle 210 is formed on one surface of the reticle stage 200 and allows the shielding gas to flow to the reticle surface to form an air curtain. For example, the nozzle 210 is formed on a first surface of the reticle stage 200, thereby continuously supplying the shielding gas in a first direction 1000. The nozzle 210 may be configured such that the shielding gas flows in parallel with the reticle surface. The nozzle 210 may be configured such that the shielding gas flows in close vicinity to the reticle surface. The shielding gas is continuously supplied to the reticle surface, thereby preventing the reticle surface from being contaminated due to particles.

It is also possible to prevent regions other than the reticle surface (for example, edge portions of the reticle stage 200) from being contaminated due to particles using the shielding gas. For example, it is possible to prevent local concentrations of the particles.

Figure 5:
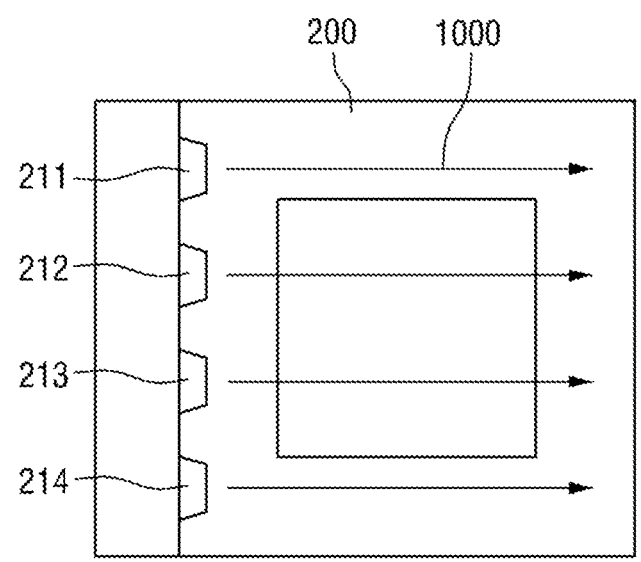
FIG. 5 is a bottom view of a portion of a lithography apparatus according to another example embodiment of inventive concepts.

FIG. 5 is a bottom view of a portion of a lithography apparatus according to another example embodiment of inventive concepts. For the sake of convenient explanation, the following description will focus on differences between the lithography apparatuses according to the present and previous example embodiments.

Referring to FIG. 5, in the lithography apparatus according to the present example embodiment, a plurality of nozzles 211 to 214 may be formed on a first surface of a reticle stage 200. However, example embodiments do not limit the number of nozzles. The plurality of nozzles 211 to 214 may continuously supply the shielding gas in a first direction 1000. The plurality of nozzles 211 to 214 may be configured such that the shielding gas flows in parallel with the reticle surface. The plurality of nozzles 211 to 214 may be configured such that the shielding gas flows in close vicinity to the reticle surface. The shielding gas is continuously supplied to the reticle surface, thereby preventing the reticle surface from being contaminated due to particles.

Figure 6:
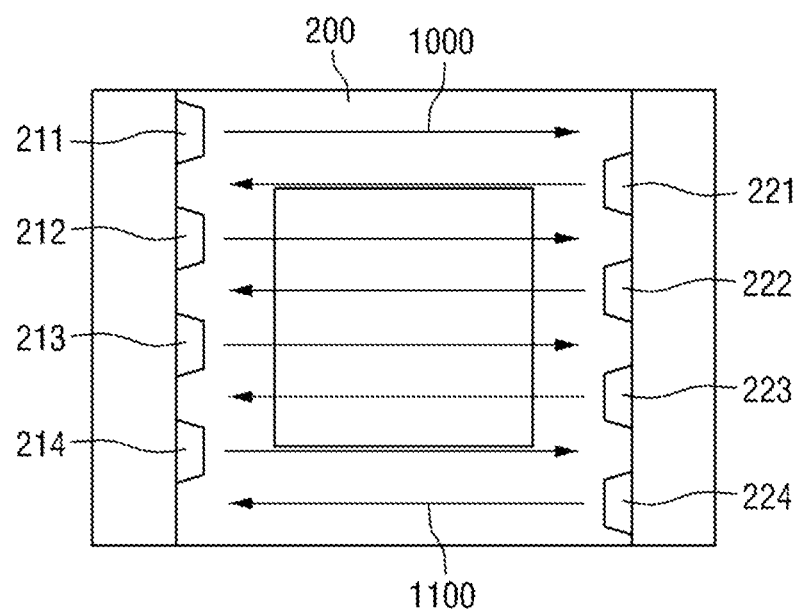
FIGS. 6 and 7 are bottom views illustrating a portion of a lithography apparatus according to still another example embodiment of inventive concepts.
Figure 7:
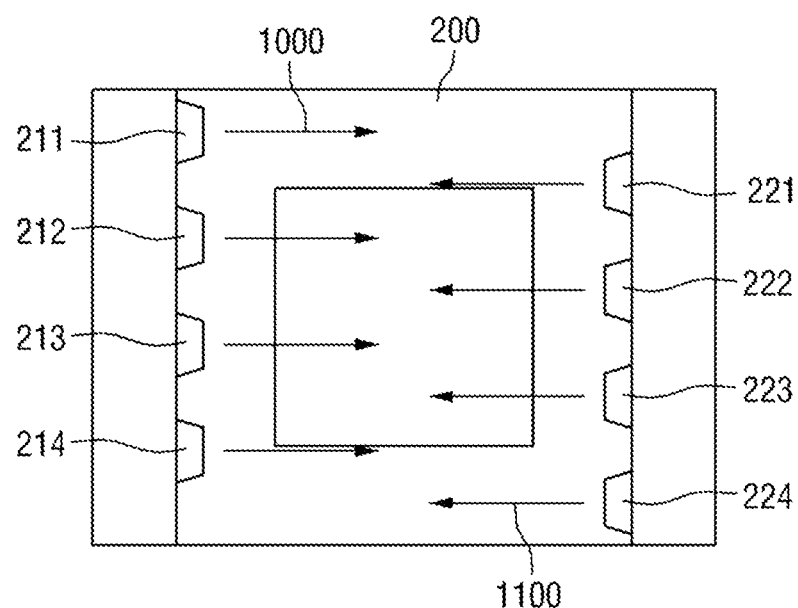

FIGS. 6 and 7 are bottom views illustrating a portion of a lithography apparatus according to still another example embodiment of inventive concepts. For the sake of convenient explanation, the following description will focus on differences between the lithography apparatuses according to the present and previous example embodiments.

Referring to FIGS. 6 and 7, in the lithography apparatus according to the present example embodiment, a plurality of nozzles 211 to 214 may be formed on a first surface of a reticle stage 200, and a plurality of nozzles 221 to 224 may be formed on a second surface opposite to the first surface of the reticle stage 200. However, example embodiments do not limit the number of nozzles. The plurality of nozzles 211 to 214 formed on the first surface of the reticle stage 200 may continuously supply the shielding gas in a first direction 1000. The plurality of nozzles 221 to 224 formed on the second surface of the reticle stage 200 may continuously supply the shielding gas in a second direction 1100 opposite to the first direction 1000. The flow of the shielding gas flowing in the first direction 1000 and the flow of the shielding gas flowing in the second direction 1100 may alternate. The plurality of nozzles 211 to 214 and 221 to 224 may be configured such that the shielding gas flows in parallel with the reticle surface. The plurality of nozzles 211 to 214 and 221 to 224 may be configured such that the shielding gas flows in close vicinity to the reticle surface. The shielding gas is continuously supplied to the reticle surface, thereby preventing the reticle surface from being contaminated due to particles.

Figure 8:
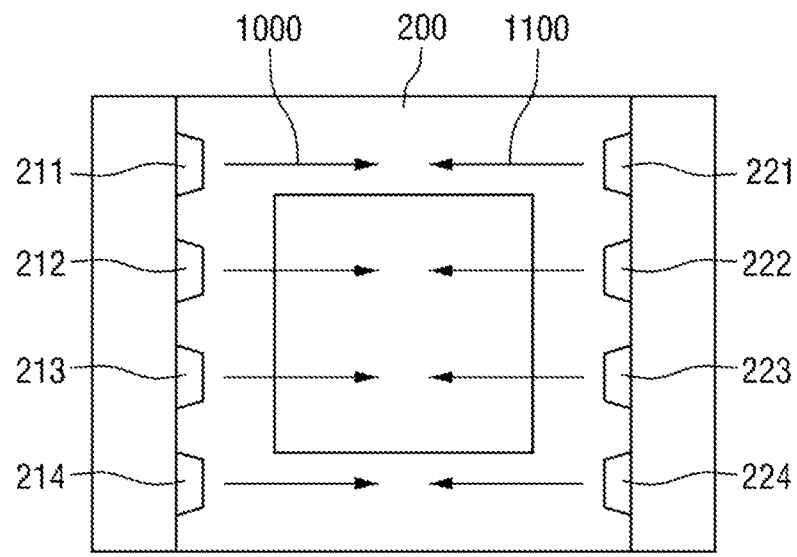
FIG. 8 is a bottom view illustrating a portion of a lithography apparatus according to still another example embodiment of inventive concepts.

FIG. 8 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 8, in the lithography apparatus according to the present example embodiment, a plurality of nozzles 211 to 214 may be formed on a first surface of a reticle stage 200 or on a second surface opposite to the first surface of the reticle stage 200. However, example embodiments do not limit the number of nozzles. The plurality of nozzles 211 to 214 may continuously supply the shielding gas in a first direction 1000. The plurality of nozzles 221 to 224 formed on the second surface of the reticle stage 200 may continuously supply the shielding gas in a second direction 1100 opposite to the first direction 1000. The flow of the shielding gas flowing in the first direction 1000 and the flow of the shielding gas flowing in the second direction 1100 may oppose each other. The plurality of nozzles 211 to 214 and 221 to 224 may be configured such that the shielding gas flows in parallel with the reticle surface. The plurality of nozzles 211 to 214 and 221 to 224 may be configured such that the shielding gas flows in close vicinity to the reticle surface. The shielding gas is continuously supplied to the reticle surface, thereby preventing the reticle surface from being contaminated due to particles.

Figure 9:
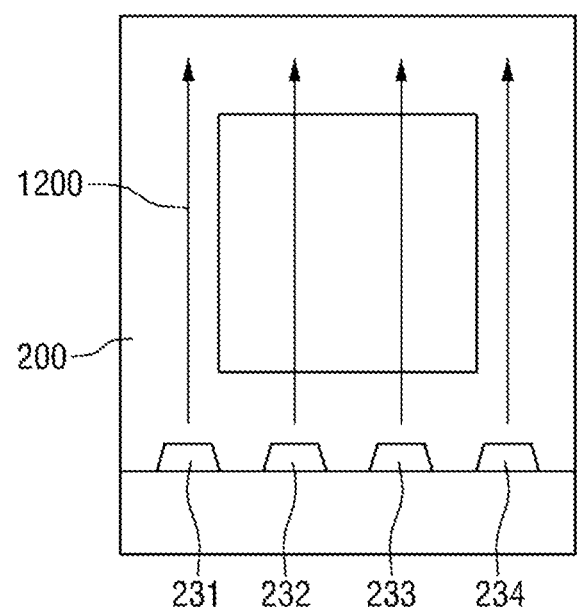
FIG. 9 is a bottom view illustrating a portion of a lithography apparatus according to still another example embodiment of inventive concepts.

FIG. 9 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 9, in the lithography apparatus according to the present example embodiment, a plurality of nozzles 231 to 234 may be formed on a third surface of a reticle stage 200. However, example embodiments do not limit the number of nozzles. The plurality of nozzles 231 to 234 may continuously supply the shielding gas in a third direction 1200. The plurality of nozzles 231 to 234 may be configured such that the shielding gas flows in parallel with the reticle surface. The plurality of nozzles 231 to 234 may be configured such that the shielding gas flows in close vicinity to the reticle surface. The shielding gas is continuously supplied to the reticle surface, thereby preventing the reticle surface from being contaminated due to particles.

Figure 10:
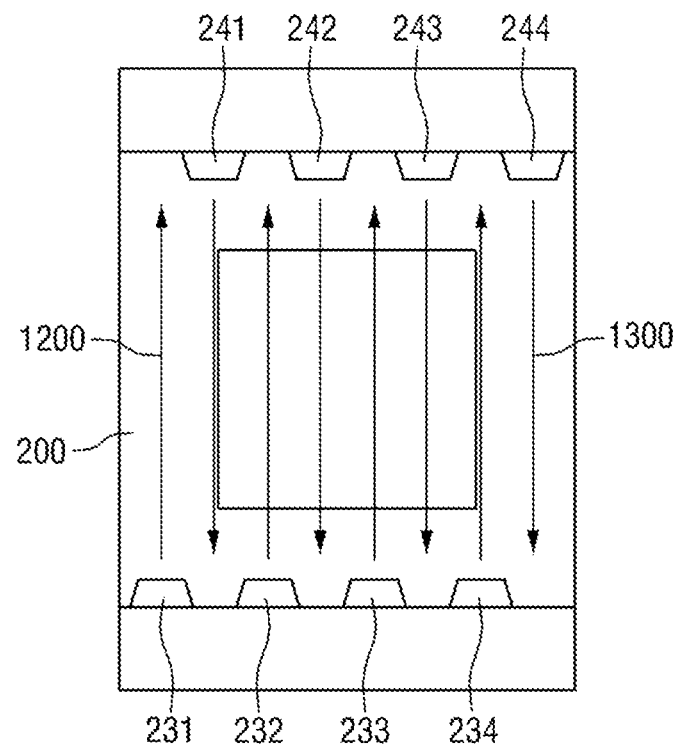
FIGS. 10 and 11 are bottom views illustrating a portion of a lithography apparatus according to still another example embodiment of inventive concepts.
Figure 11:
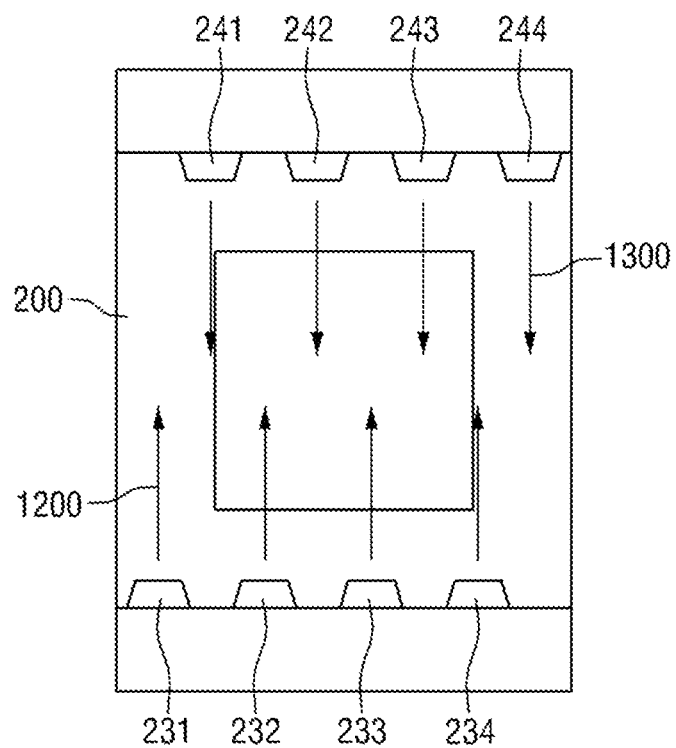

FIGS. 10 and 11 are bottom views illustrating a portion of a lithography apparatus according to still another example embodiment of inventive concepts. For the sake of convenient explanation, the following description will focus on differences between the lithography apparatuses according to the present and previous example embodiments.

Referring to FIGS. 10 and 11, in the lithography apparatus according to the present example embodiment, a plurality of nozzles 231 to 234 may be formed on a third surface of a reticle stage 200, and a plurality of nozzles 241 to 244 may be formed on a fourth surface opposite to the third surface of the reticle stage 200. However, example embodiments do not limit the number of nozzles. The plurality of nozzles 231 to 234 formed on the third surface of the reticle stage 200 may continuously supply the shielding gas in a third direction 1200, and the plurality of nozzles 241 to 244 formed on the fourth surface of the reticle stage 200 may continuously supply the shielding gas in a fourth direction 1300. The flow of the shielding gas flowing in the third direction 1200 and the flow of the shielding gas flowing in the fourth direction 1300 may alternate. The plurality of nozzles 231 to 234 and 241 to 244 may be configured such that the shielding gas flows in parallel with the reticle surface. The plurality of nozzles 231 to 234 and 241 to 244 may be configured such that the shielding gas flows in close vicinity to the reticle surface. The shielding gas is continuously supplied to the reticle surface, thereby preventing the reticle surface from being contaminated due to particles.

Figure 12:
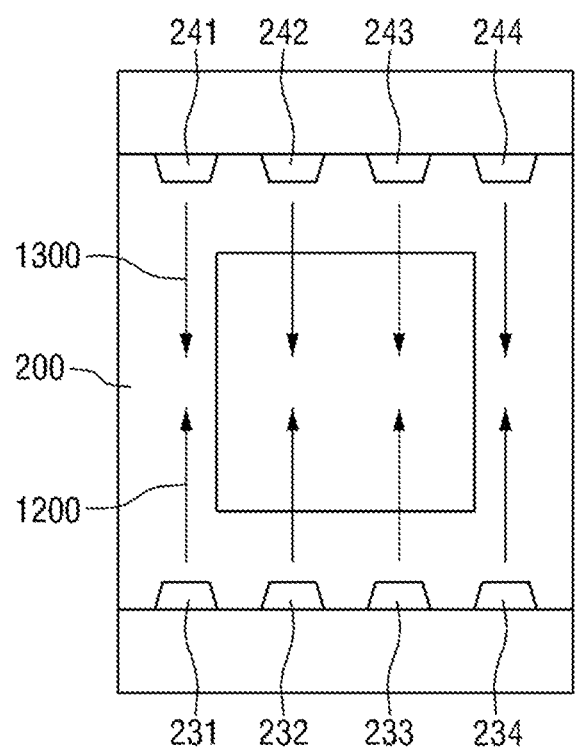
FIG. 12 is a bottom view illustrating a portion of a lithography apparatus according to still another example embodiment of inventive concepts.

FIG. 12 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 12, in the lithography apparatus according to the present example embodiment, a plurality of nozzles 231 to 234 may be formed on a third surface of a reticle stage 200, and a plurality of nozzles 241 to 244 may be formed on a fourth surface opposite to the third surface of the reticle stage 200. However, example embodiments do not limit the number of nozzles. The plurality of nozzles 231 to 234 formed on the third surface of the reticle stage 200 may continuously supply the shielding gas in a third direction 1200, and the plurality of nozzles 241 to 244 formed on the fourth surface of the reticle stage 200 may continuously supply the shielding gas in a fourth direction 1300. The flow of the shielding gas flowing in the third direction 1200 and the flow of the shielding gas flowing in the fourth direction 1400 may oppose each other.

The plurality of nozzles 231 to 234 and 241 to 244 may be configured such that the shielding gas flows in parallel with the reticle surface. The plurality of nozzles 231 to 234 and 241 to 244 may be configured such that the shielding gas flows in close vicinity to the reticle surface. The shielding gas is continuously supplied to the reticle surface, thereby preventing the reticle surface from being contaminated due to particles.

Figure 13:
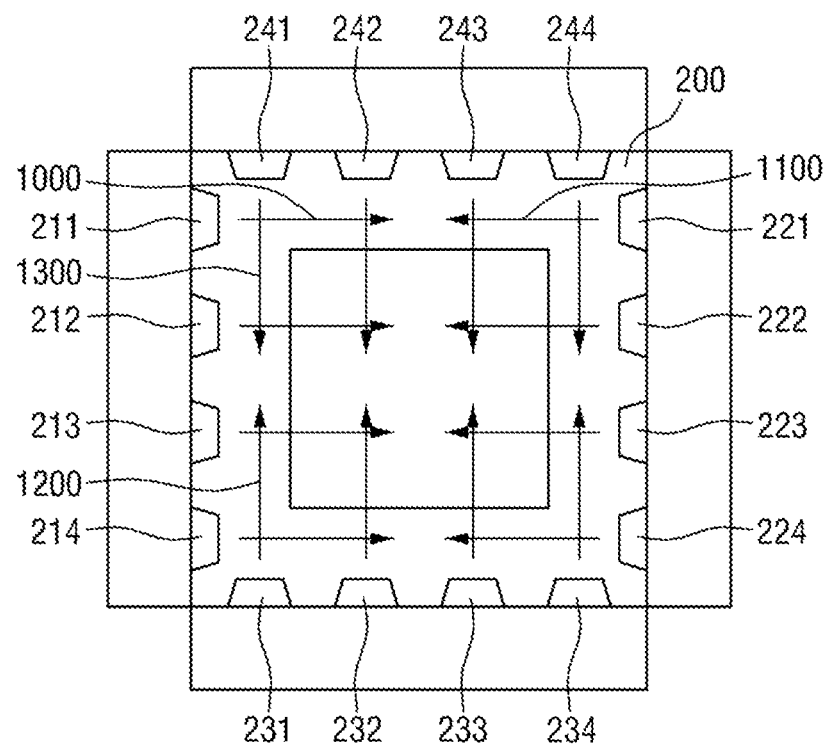
FIG. 13 is a bottom view illustrating a portion of a lithography apparatus according to still another example embodiment of inventive concepts.

FIG. 13 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 13, in the lithography apparatus according to the present example embodiment, a plurality of nozzles 211 to 214 may be formed on a first surface of a reticle stage 200, a plurality of nozzles 221 to 224 may be formed on a second surface, a plurality of nozzles 231 to 234 may be formed on a third surface, and a plurality of nozzles 241 to 244 may be formed on a fourth surface of the reticle stage 200. However, example embodiments do not limit the number of nozzles. The plurality of nozzles 211 to 214 formed on the first surface of the reticle stage 200 may continuously supply the shielding gas in a first direction 1000, the plurality of nozzles 221 to 224 formed on the second surface of the reticle stage 200 may continuously supply the shielding gas in a second direction 1100, the plurality of nozzles 231 to 234 formed on the third surface of the reticle stage 200 may continuously supply the shielding gas in a third direction 1200, and the plurality of nozzles 241 to 244 formed on the fourth surface of the reticle stage 200 may continuously supply the shielding gas in a fourth direction 1300. The flows of the shielding gases flowing in the first to fourth directions 1000 to 1300 may be in the form of a mesh. The plurality of nozzles 211 to 214, 221 to 224, 231 to 234 and 241 to 244 may be configured such that the shielding gas flows in close vicinity to the reticle surface. The shielding gas is continuously supplied to the reticle surface, thereby preventing the reticle surface from being contaminated due to particles.

Figure 14:
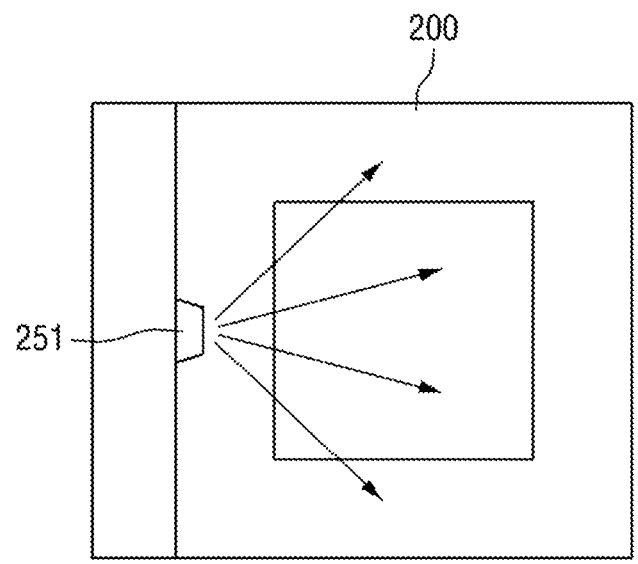
FIG. 14 is a bottom view illustrating a portion of a lithography apparatus according to still another example embodiment of inventive concepts.

FIG. 14 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 14, in the lithography apparatus according to the present example embodiment, a nozzle 251 may be formed on a first surface of a reticle stage 200 and may continuously supply shielding gases while rotating. The flow of the shielding gases may be in the form of a fan. However, example embodiments do not limit the number of nozzles. The nozzle 251 may be configured such that the shielding gas flows in parallel with the reticle surface. The nozzle 251 may be configured such that the shielding gas flows in close vicinity to the reticle surface. The shielding gas is continuously supplied to the reticle surface, thereby preventing the reticle surface from being contaminated due to particles.

Figure 15:
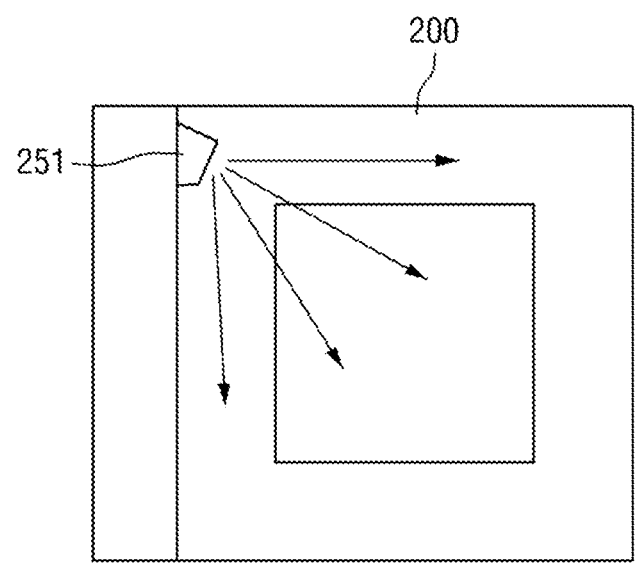
FIG. 15 is a bottom view illustrating a portion of a lithography apparatus according to still another example embodiment of inventive concepts.

FIG. 15 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 15, in the lithography apparatus according to the present example embodiment, a nozzle 251 may be formed at a corner of a reticle stage 200 and may continuously supply shielding gases while rotating. The flow of the shielding gases may be in the form of a fan. However, example embodiments do not limit the number of nozzles. The nozzle 251 may be configured such that the shielding gas flows in parallel with the reticle surface. The nozzle 251 may be configured such that the shielding gas flows in close vicinity to the reticle surface. The shielding gas is continuously supplied to the reticle surface, thereby preventing the reticle surface from being contaminated due to particles.

Figure 16:
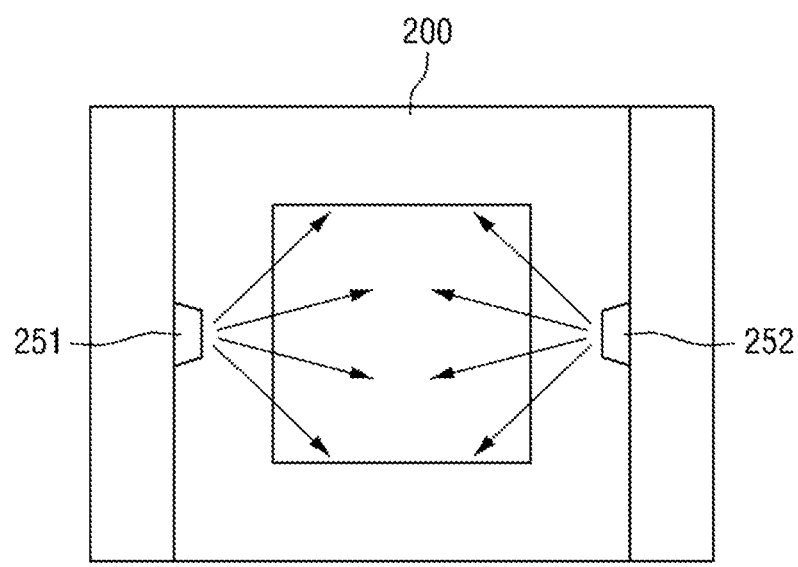
FIG. 16 is a bottom view illustrating a portion of a lithography apparatus according to still another example embodiment of inventive concepts.

FIG. 16 is a bottom view illustrating a portion of a lithography apparatus according to still another example embodiment of inventive concepts. For the sake of convenient explanation, the following description will focus on differences between the lithography apparatuses according to the present and previous example embodiments.

Referring to FIG. 16, in the lithography apparatus according to the present example embodiment, a nozzle 251 may be formed on a first surface of a reticle stage 200, and a nozzle 252 may be formed on a second surface of the reticle stage 200. The nozzles 251 and 252 may continuously supply shielding gases while rotating. The flow of the shielding gases may be in the form of a fan. However, example embodiments do not limit the number of nozzles. The nozzles 251 and 252 may be configured such that the shielding gas flows in parallel with the reticle surface. The nozzles 251 and 252 may be configured such that the shielding gas flows in close vicinity to the reticle surface. The shielding gas is continuously supplied to the reticle surface, thereby preventing the reticle surface from being contaminated due to particles.

Figure 17:
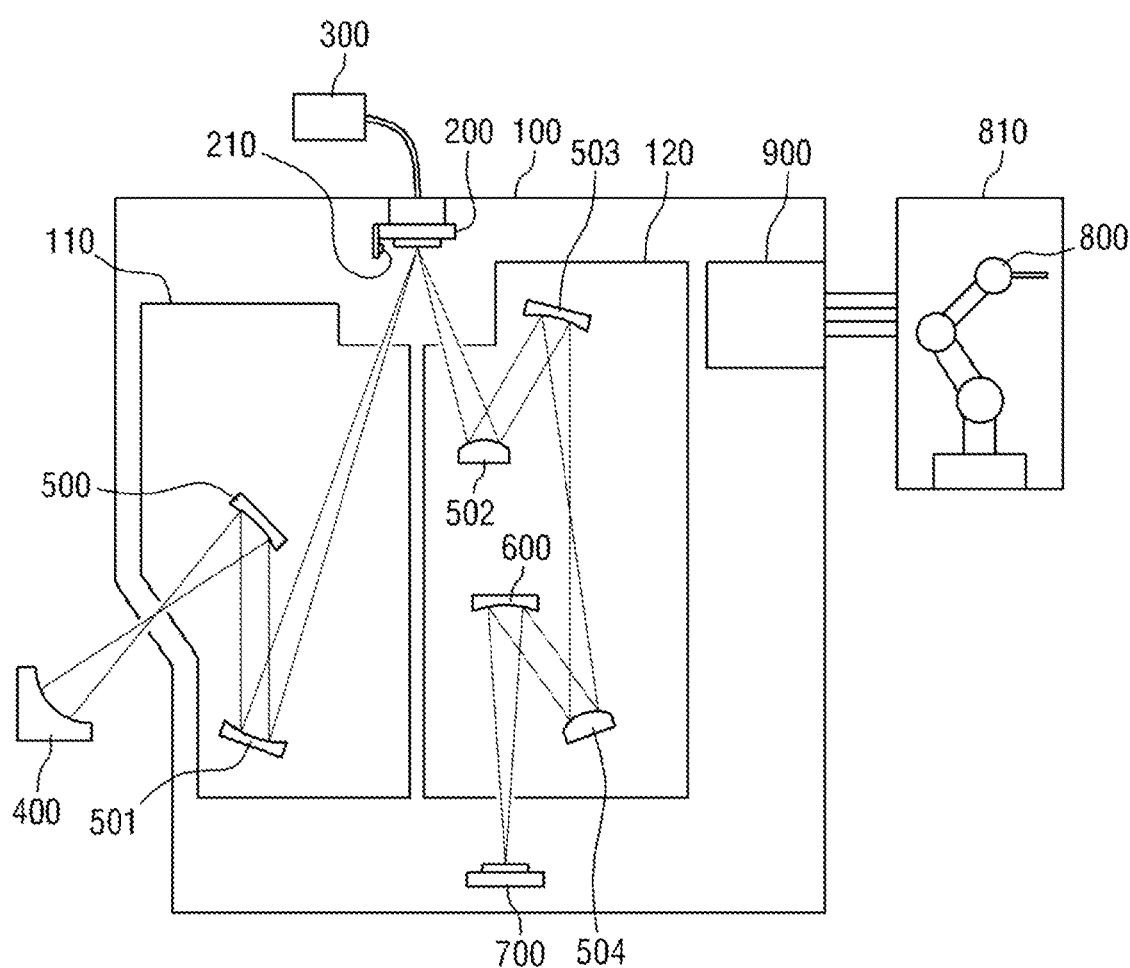
FIG. 17 illustrates a lithography method according to an example embodiment of inventive concepts.

Hereinafter, a lithography method according to an example embodiment of inventive concepts will be described. FIG. 17 illustrates a lithography method according to an example embodiment of inventive concepts.

Referring to FIG. 17, a reticle is moved to a reticle stage 200 by a reticle handler 800 via a robot chamber 900. The reticle is fixed on the reticle stage 200. A reticle handler chamber 810 and a robot chamber 900 may be maintained at vacuum.

After the reticle is fixed on the reticle stage 200, a shielding gas is continuously supplied to the reticle surface through a nozzle 210 formed on one surface of the reticle stage 200 (for example, a first surface of the reticle stage 200). The backfill gas of the reticle stage 200 and the shielding gas may be the same gas. For example, the shielding gas may be hydrogen ($H_2$) gas.

The source 400 may irradiate exposure light into a reflection mirror 500 in a first sub chamber 110. The source 400 may be, for example, a discharge produced plasma (DPP) EUV light source, a laser produced plasma (LPP) EUV light source, a hybrid EUV light source, a synchrotron EUV light source, or the like. The exposure light may be reflected in a plurality of illumination system reflection mirrors 500 and 501 in the first sub chamber 110 to reach a reticle surface. The exposure light reflected from the reticle surface may be reflected at a plurality of projection optical system reflection mirrors 502, 503, 504 and 600 to then be irradiated into a wafer.

Hereinafter, a stage system according to an example embodiment of inventive concepts will be described.

Referring back to FIG. 2, a nozzle 210 is formed on one surface of the reticle stage 200. However, example embodiments do not limit the number of nozzles. The nozzle 210 allows the shielding gas to flow to the reticle surface to form an air curtain. The nozzle 210 may continuously supply the shielding gas to the reticle surface. The nozzle 210 may be configured such that the shielding gas flows in parallel with the reticle surface. The nozzle 210 may be configured such that the shielding gas flows in close vicinity to the reticle surface. The shielding gas is continuously supplied to the reticle surface, thereby preventing the reticle surface from being contaminated due to particles.

While some example embodiments have been particularly shown and described with reference to some example embodiments thereof, it will be understood by those of ordinary skill in the art that various changes in form and details may be made therein without departing from the spirit and scope of the example embodiments as defined by the following claims. It is therefore desired that the present example embodiments be considered in all respects as illustrative and not restrictive, reference being made to the appended claims rather than the foregoing description to indicate the scope of example embodiments.

What is claimed is:

1. A lithography apparatus, comprising:
   a reticle stage having a reticle that is an extreme ultraviolet (EUV) mask;
   a plurality of nozzles on at least one surface of the reticle stage and configured to direct shielding gas to flow to a surface of the reticle to form an air curtain, one of the plurality of nozzles and another one of the plurality of nozzles being configured to direct the shielding gas to flow in an orthogonal direction with respect to each other, and in parallel with the surface of the reticle, the plurality of nozzles being configured to move together with the reticle stage, and the shielding gas protecting the surface of the reticle; and
   a gas supply unit configured to supply the plurality of nozzles with the shielding gas.

2. The lithography apparatus of claim 1, wherein each of the plurality of nozzles is configured to direct the shielding gas to flow while rotating, forming the air curtain in a fan shape.

3. The lithography apparatus of claim 1, wherein a backfill gas of the reticle stage is the same as the shielding gas.

4. The lithography apparatus of claim 1, wherein the shielding gas is hydrogen ($H_2$) gas.

5. The lithography apparatus of claim 1, wherein the reticle is fixed on the reticle stage by an electrostatic force.

6. The lithography apparatus of claim 1, further comprising:
   a source configured to supply exposure light;
   at least one illumination system reflection mirror configured to reflect the exposure light to the reticle stage;
   at least one projection optics reflection mirror configured to project the reflected exposure light onto a wafer; and
   a wafer stage on which the wafer is fixed.

7. The lithography apparatus of claim 6, wherein the exposure light is extreme ultraviolet (EUV) light.

8. The lithography apparatus of claim 1, further comprising:
   an illumination system included in a first chamber and configured to reflect an exposure light to the reticle stage; and
   a projection system included in a second chamber and configured to project the reflected exposure light onto a wafer.

9. The lithography apparatus of claim 1, wherein at least one of the first chamber and the second chamber includes a vacuum.

10. A stage system, comprising:
    a reticle stage having a reticle that is an extreme ultraviolet (EUV) mask; and
    first and second nozzles on a surface of the reticle stage and configured to direct shielding gas to flow to a surface of the reticle to form an air curtain, the first and second nozzles being configured to direct the shielding gas to flow in an orthogonal direction with respect to each other, and in parallel with the surface of the reticle, the first and second nozzles being configured to move together with the reticle stage, and the shielding gas protecting the surface of the reticle.

11. The stage system of claim 10, further comprising:
an illumination system included in a first chamber and configured to reflect an exposure light to the reticle stage; and
a projection system included in a second chamber and configured to project the reflected exposure light onto a wafer.

12. The stage system of claim 10, wherein at least one of the first chamber and the second chamber includes a vacuum.

13. A lithography apparatus, comprising:
a reticle stage having a reticle that is an extreme ultraviolet (EUV) mask;
one or more nozzles on at least one surface of the reticle stage and configured to direct a shielding gas to a surface of a reticle, the one or more nozzles being configured to direct the shielding gas to flow in an orthogonal direction with respect to each other, and in parallel with the surface of the reticle, and being configured to move together with the reticle stage, and the shielding gas protecting the surface of the reticle;
a gas supply unit configured to supply the one or more nozzles with the shielding gas;
a source configured to supply exposure light;
at least one illumination system reflection mirror configured to reflect the exposure light to the reticle stage;
at least one projection optics reflection mirror configured to project the reflected exposure light onto a wafer; and
a wafer stage on which the wafer is fixed.

14. The lithography apparatus of claim 13, wherein a first portion of the one or more nozzles direct the shielding gas in a first direction and a second portion of the one or more nozzles direct the shielding gas in a second direction, the first portion of the one or more nozzles alternatingly spaced with the second portion of the one or more nozzles.

15. The lithography apparatus of claim 13, wherein a first portion of the one or more nozzles direct the shielding gas in a first direction and a second portion of the one or more nozzles direct the shielding gas in a second direction opposite to the first direction, the first portion of the one or more nozzles and the second portion of the one or more nozzles opposing each other.

16. The lithography apparatus of claim 13, wherein the one or more nozzles are configured to supply the shielding gas while rotating, forming an air curtain in a fan shape.

17. The lithography apparatus of claim 16, wherein the one or more nozzles include a first nozzle and a second nozzle, the second nozzle forming the air curtain in the fan shape opposite the first nozzle.

18. The lithography apparatus of claim 13, wherein the exposure light is extreme ultraviolet (EUV) light.

19. The lithography apparatus of claim 13, further comprising:
an illumination system included in a first chamber and configured to reflect an exposure light to the reticle stage; and
a projection system included in a second chamber and configured to project the reflected exposure light onto a wafer.

20. The lithography apparatus of claim 13, wherein at least one of the first chamber and the second chamber includes a vacuum.

* * * * *